United States Patent
Kobayashi

(10) Patent No.: US 8,709,955 B2
(45) Date of Patent: Apr. 29, 2014

(54) PATTERN TRANSFER APPARATUS AND METHOD FOR FABRICATING SEMICONDUCTOR DEVICE

(75) Inventor: Yuji Kobayashi, Mie (JP)

(73) Assignee: Kabushiki Kaisha Toshiba, Tokyo (JP)

(*) Notice: Subject to any disclaimer, the term of this patent is extended or adjusted under 35 U.S.C. 154(b) by 246 days.

(21) Appl. No.: 13/422,942

(22) Filed: Mar. 16, 2012

(65) Prior Publication Data

US 2013/0052835 A1 Feb. 28, 2013

(30) Foreign Application Priority Data

Aug. 31, 2011 (JP) ................................ 2011-189465

(51) Int. Cl.
*H01L 21/302* (2006.01)
*B29C 59/02* (2006.01)
*H01L 21/31* (2006.01)

(52) U.S. Cl.
USPC ............................. 438/758; 118/620; 977/887

(58) Field of Classification Search
CPC ...... G03F 7/0002; H01L 21/302; B29C 59/02
USPC ......................................................... 977/887
See application file for complete search history.

(56) References Cited

U.S. PATENT DOCUMENTS

| | | | |
|---|---|---|---|
| 7,802,978 B2 | 9/2010 | Sreenivasan et al. | |
| 7,878,791 B2* | 2/2011 | Simon et al. | 425/345 |
| 2005/0230346 A1 | 10/2005 | Kasumi et al. | |
| 2006/0192928 A1* | 8/2006 | Kasumi et al. | 355/30 |
| 2008/0018875 A1 | 1/2008 | Schram et al. | |
| 2008/0254626 A1* | 10/2008 | Kasumi et al. | 438/689 |
| 2009/0047606 A1 | 2/2009 | Schram et al. | |
| 2010/0078840 A1* | 4/2010 | Kawakami et al. | 264/40.1 |
| 2010/0233377 A1* | 9/2010 | Aoki et al. | 427/355 |
| 2011/0189329 A1 | 8/2011 | Miller et al. | |

FOREIGN PATENT DOCUMENTS

| | | |
|---|---|---|
| JP | 8-51052 | 2/1996 |
| JP | 2005-286061 | 10/2005 |
| JP | 2010-41050 | 2/2010 |
| JP | 2010-145785 | 7/2010 |

\* cited by examiner

*Primary Examiner* — Charles Garber
*Assistant Examiner* — Alia Sabur
(74) *Attorney, Agent, or Firm* — Oblon, Spivak, McClelland, Maier & Neustadt, L.L.P.

(57) ABSTRACT

A pattern transfer apparatus according to one embodiment includes a transfer region selecting part that performs operation in which when performing pattern transfer from a template provided with N transfer regions (N is an integer of 2 or larger) to a transferring substrate a plurality of times, 1 to N−1 transfer regions, which are to be used to perform the transfer to regions of the transferring substrate corresponding to part of the N transfer regions, are selected such that the number of the transfer to be performed using each of the N transfer regions is evened out.

20 Claims, 5 Drawing Sheets

__US 8,709,955 B2__

PATTERN TRANSFER APPARATUS AND METHOD FOR FABRICATING SEMICONDUCTOR DEVICE

CROSS-REFERENCE TO RELATED APPLICATIONS

This application is based upon and claims the benefit of priority from Japanese Patent Application No. 2011-189465, filed on Aug. 31, 2011; the entire contents of which are incorporated herein by reference.

FIELD

Embodiments described herein relate generally to a pattern transfer apparatus and methods for fabricating a semiconductor device.

BACKGROUND

Attention is being given to a nanoimprinting method in which a pattern formed at an original plate is transferred to transferring substrates in a semiconductor device fabrication process. The nanoimprinting method is a method in which an original plate at which a pattern to be transferred is formed (i.e., a template) is pressed on a resist layer of an imprinting material applied on a substrate, and then the resist layer is cured to transfer the pattern to the resist layer. In the nanoimprinting pattern formation method, breakage and defects sometimes occur at templates since imprinting is done by firmly pressing the templates to wafers.

DETAILED DESCRIPTION

A pattern transfer apparatus according to the present embodiment is provided with a transfer region selecting part. When performing pattern transfer from a template provided with N transfer regions (N is an integer of 2 or larger) to a transferring substrate a plurality of times, the transfer region selecting part selects 1 to N−1 transfer regions to be used to perform the transfer to regions of the transferring substrate corresponding to part of the N transfer regions such that the number of the transfer to be performed using each of the N transfer regions is evened out.

The pattern transfer apparatus and methods for fabricating a semiconductor device according to the present embodiments will be described below with reference to the accompanying drawings; however, note that the present invention is not limited to these embodiments.

First Embodiment

Figure 1:
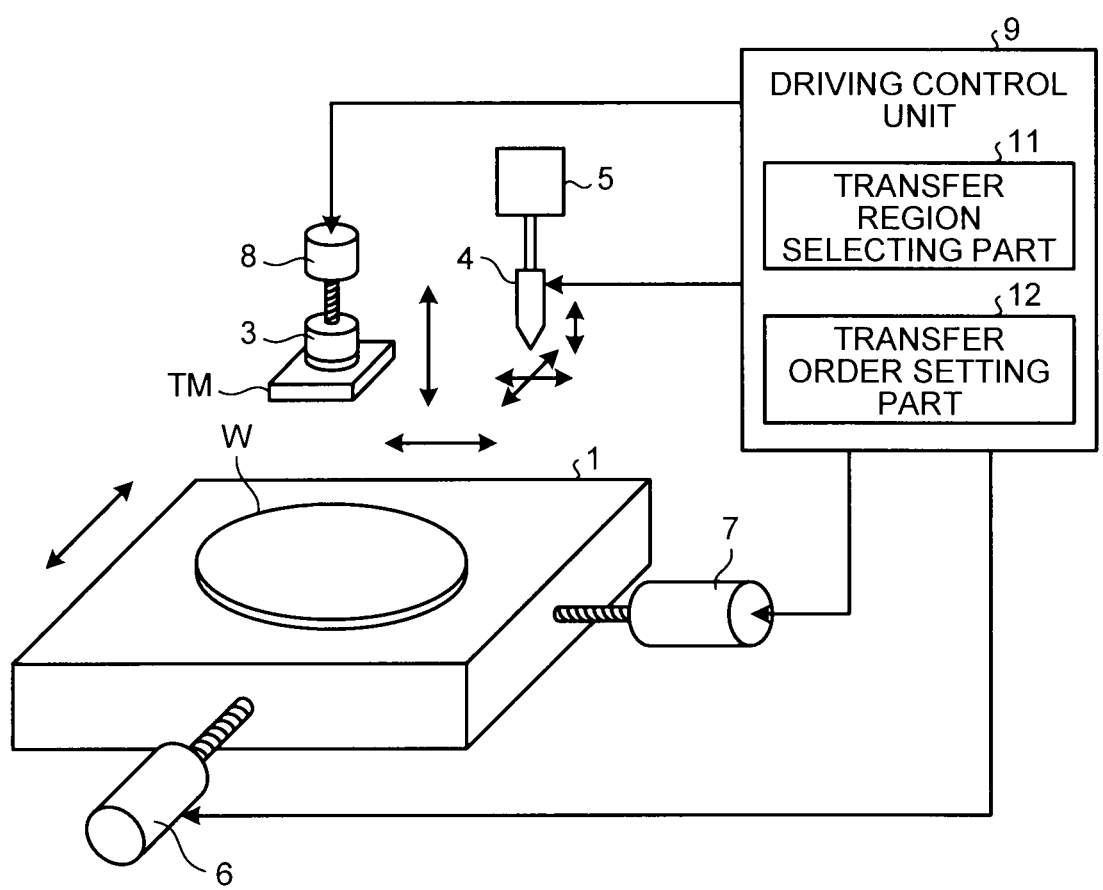
FIG. 1 is a schematic perspective view of a pattern transfer apparatus according to a first embodiment.

FIG. 1 is a schematic perspective view of a pattern transfer apparatus according to a first embodiment.

As illustrated in FIG. 1, the pattern transfer apparatus is provided with a stage 1 that holds a wafer W used as a transferring substrate, a template TM to be used for imprinting, a nozzle 4 that delivers an imprinting material onto the wafer W, and an ultraviolet irradiating unit 3 that irradiates the imprinting material on the wafer W with ultraviolet light via the template TM.

The template TM is provided with N transfer regions (N is an integer of 2 or larger). The transfer regions can be provided such that a one-to-one correspondence is established between the transfer regions and the chip regions of the wafer W. The nozzle 4 is coupled to a tank 5 that stores the imprinting material, and can be moved above the wafer W back and forth, right and left, and up and down.

The stage 1 can be moved back and forth, and right and left. The template TM can be moved up and down. The stage 1 is provided with driving parts 6 and 7 that move the stage 1 back and forth, and right and left. The template TM is provided with a driving part 8 that moves the template TM up and down.

The pattern transfer apparatus is further provided with a driving control unit 9 which drivingly controls the driving parts 6 to 8 so that the number of pattern transfer to be performed using each of the N transfer regions of the template TM is evened out. The driving control unit 9 is provided with a transfer region selecting part 11 and a transfer order setting part 12. The transfer region selecting part 11 can select the 1 to N−1 transfer regions from among the N transfer regions to even out the number of pattern transfer to be performed using each of the N transfer regions of the template TM. The transfer order setting part 12 can set the order of pattern transfer from the template TM to the wafer W such that nonselected one(s) of the transfer regions of the template TM does not collide with transfer-performed region(s) of the wafer W.

Figure 2A:
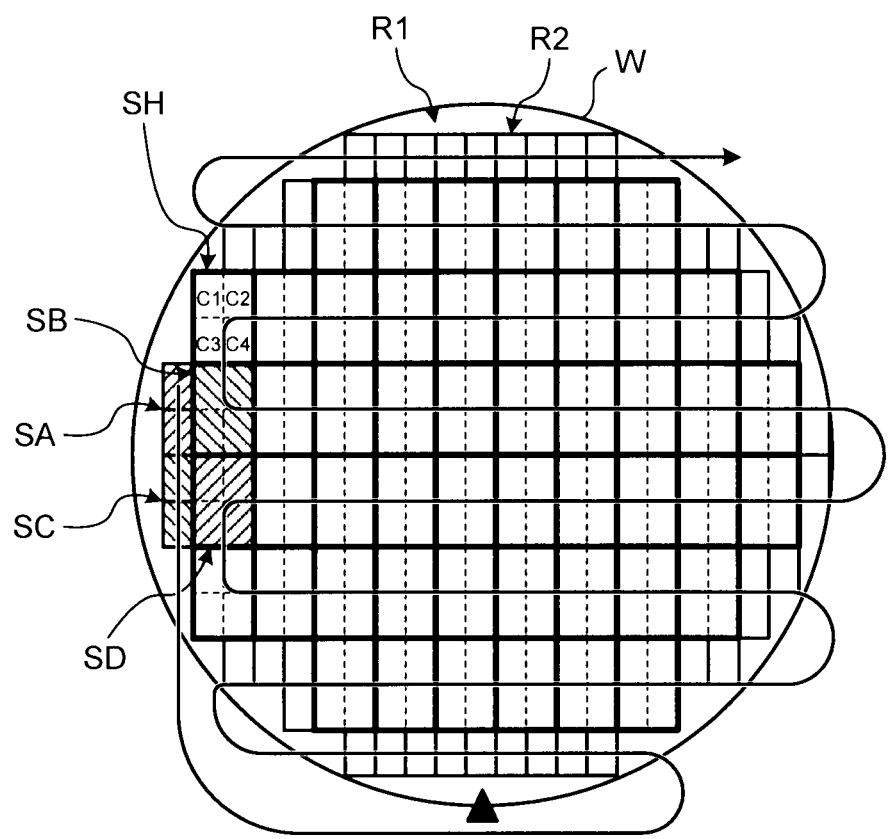
FIGS. 2A and 2B are plan views of a template and a wafer in the pattern transfer apparatus of FIG. 1 illustrating the relationship between the template and the shot regions of the wafer.
Figure 2B:
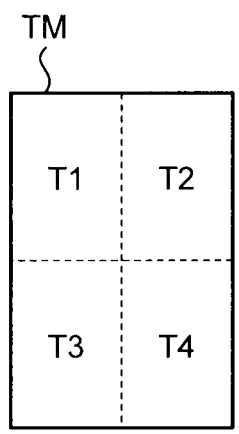

FIGS. 2A and 2B are plan views in the pattern transfer apparatus of FIG. 1 illustrating the relationship between the template and the shot regions of the wafer.

As illustrated in FIG. 2B, the template TM is provided with four transfer regions T1 to T4; as illustrated in FIG. 2A, the wafer W is provided with a pattern nonforming region R1 and a pattern forming region R2. The pattern forming region R2 is provided with shot regions SH. Each shot region SH is provided with chip regions C1 to C4. The transfer regions T1 to T4 of the template TM are allowed to respectively correspond to the chip regions C1 to C4 of the wafer W.

To begin with, an imprinting material is applied through the nozzle 4 onto the wafer W every shot region SH. Next, the ultraviolet irradiation unit 3 irradiates the imprinting material with ultraviolet light with the template TM pressed on the imprinting material to cure the imprinting material, and then the above processing is repeated from one of the shot regions SH to another, whereby imprinting patterns can be formed on the entire pattern forming region R2 of the wafer W.

In that case, however, at the perimeter of the pattern forming region R2, imperfect shots result. At the imperfect shots, only part of the four transfer regions T1 to T4 of the template TM is used. That is, at the imperfect shots, certain regions of the transfer regions T1 to T4 are frequently used, and thus the number of the transfer performed using the transfer regions T1 to T4 becomes unbalanced.

For example, since there are only two chip regions at shot regions SA and SC, imperfect shots result. In the case where it is assumed that at that time, the transfer to the shot regions SA and SC has been repeated using the transfer regions T2 and T4 of the template TM along an arrow on the wafer W, the number of the transfer performed using the transfer regions T1 and T3 of the template TM comes to 59 times, and the number of the transfer performed using the transfer regions T2 and T4 of the template TM comes to 62 times.

When the number of the transfer performed using the transfer regions T1 to T4 has become unbalanced like the above, the possibility of occurrence of breakage and defects increases at the transfer regions T2 and T4 with which the transfer has been frequently performed. And further, in the case where breakage and defects have been caused even at part of the transfer regions T1 to T4, the use of the entire template TM becomes impossible.

On the other hand, in the case where it is assumed that pattern transfer to the shot region SA has been performed using the transfer regions T1 and T3 of the template TM and pattern transfer to the shot region SC has been performed using the transfer regions T2 and T4 of the template TM, the number of the transfer performed using the transfer regions T1 and T3 of the template TM comes to 60 times, and the number of the transfer performed using the transfer regions T2 and T4 of the template TM comes to 61 times.

Therefore, when compared with the case where the transfer to the shot regions SA and SC has been performed using the transfer regions T2 and T4 of the template TM, the number of the transfer performed using the transfer regions T1 to T4 of the template TM are evened out, and thus the number of the transfer performed using the transfer regions T2 and T4 decreases. Hence it becomes possible to prevent breakage and defects from readily occurring at the transfer regions T2 and T4 of the template TM, and the life of the template TM can, therefore, be lengthened.

However, in the case where pattern transfer to the shot region SA has been performed using the transfer regions T1 and T3 of the template TM as described above, the transfer regions T2 and T4 of the template TM overlap into the shot region SB; therefore, in the case where pattern transfer to the shot region SB has already been performed, the shot region SB as a transfer-performed region collides with the transfer regions T2 and T4 of the template TM, and thus an imprinting pattern formed at the transfer-performed shot region SB is damaged.

Hence the order of pattern transfer to the shot region SA is set so that the transfer to the shot region SA is performed before the transfer to the shot region SB is performed.

Figure 3A:
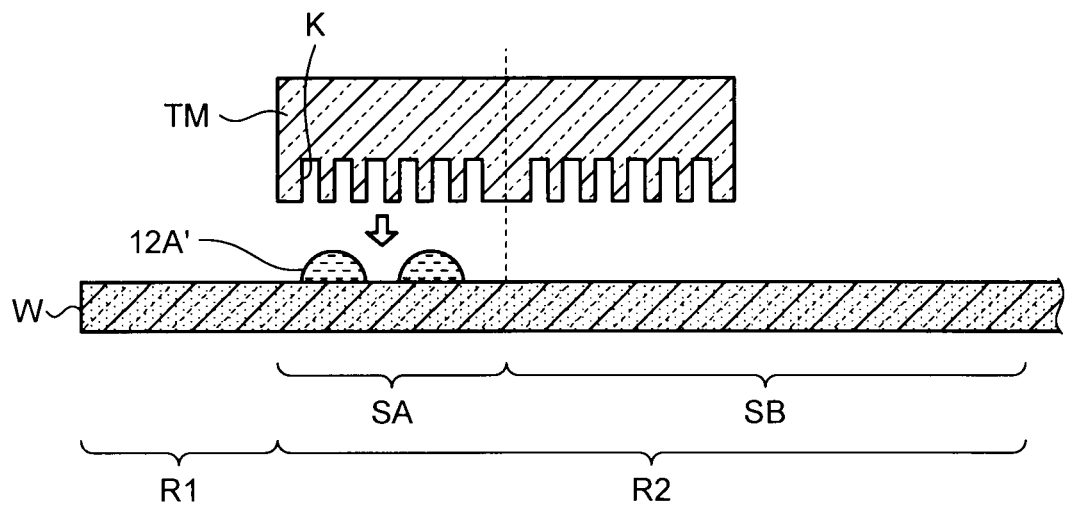
FIGS. 3A and 3B are cross-sectional views illustrating an imprinting method employed at the shot region SA of FIG. 2A.
Figure 3B:
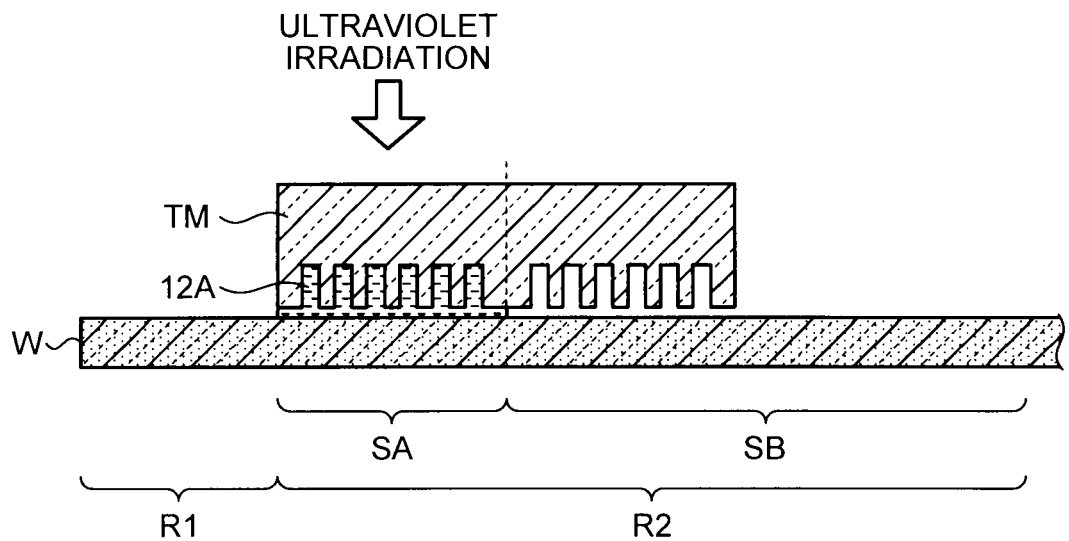

FIGS. 3A and 3B are cross-sectional views illustrating an imprinting method employed at the shot region SA of FIG. 2A.

As illustrated in FIG. 3A, the shot region SB adjoins the shot region SA. To begin with, an imprinting material 12A' is delivered through the nozzle 4 onto the shot region SA of the wafer W by using a method such as an inkjet method. Incidentally, as the imprinting material 12A', an ultraviolet cure resist, for example, can be used.

Next, as illustrated in FIG. 3B, the template TM is pressed on the imprinting material 12A' to form an imprinting pattern 12A on the wafer W. Incidentally, the template TM can be made of quartz, for example. In this embodiment, in the template TM are formed concave portions K corresponding to the imprinting pattern 12A; that is, by pressing the template TM on the imprinting material 12A', the imprinting material 12A' is sucked up into the concave portions K by a capillary phenomenon, whereby the imprinting pattern 12A corresponding to the shape of the concave portions K is formed.

Thereafter, by irradiating the imprinting pattern 12A with ultraviolet light through the template TM with the template TM pressed on the imprinting pattern 12A, the imprinting pattern 12A cures.

In the example of FIG. 3B, an ultraviolet cure resist may be used as the imprinting material 12A' to cure the imprinting pattern 12A, but a thermosetting resist may be used.

When forming the imprinting pattern 12A at the shot region SA, the transfer regions T1 and T3 of the template TM can be pressed on the imprinting material 12A'. And further, before forming an imprinting pattern 12B (see FIG. 5B) at the shot region SB, the imprinting pattern 12A can be formed at the shot region SA. Therefore, in the case where the transfer regions T2 and T4 of the template TM also overlap into the shot region SB when forming the imprinting pattern 12A at the shot region SA, it is possible to prevent the imprinting pattern 12B at the shot region SB from being damaged.

Figure 4A:
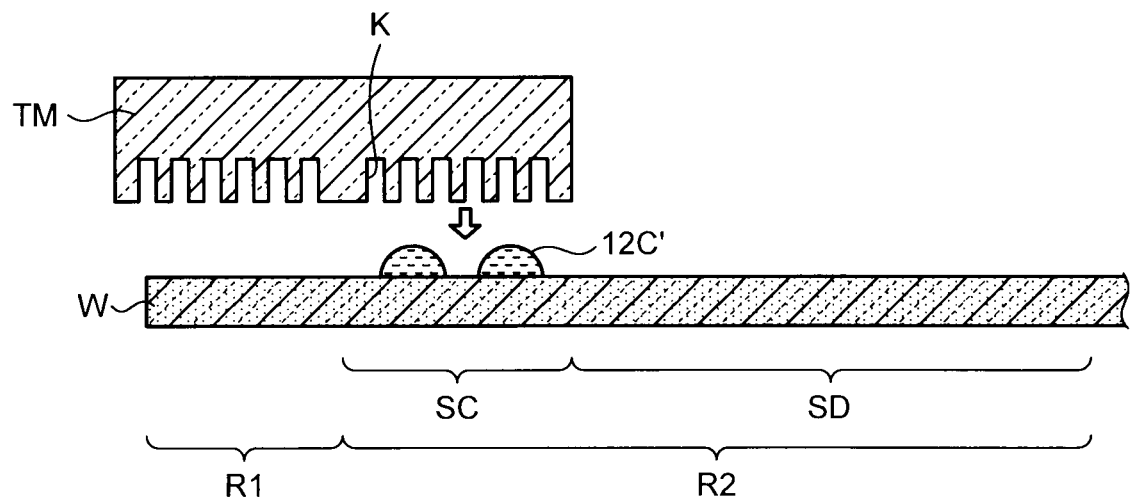
FIGS. 4A and 4B are cross-sectional views illustrating an imprinting method employed at the shot region SC of FIG. 2A.
Figure 4B:
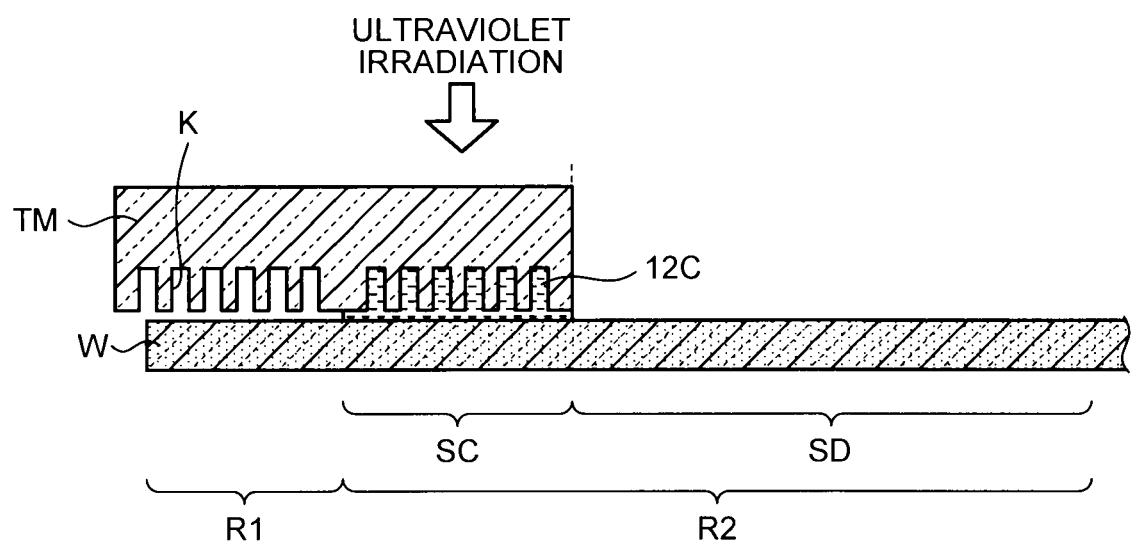

FIGS. 4A and 4B are cross-sectional views illustrating an imprinting method employed at the shot region SC of FIG. 2A.

As illustrated in FIG. 4A, the shot region SD adjoins the shot region SC. To begin with, an imprinting material 12C' is delivered through the nozzle 4 onto the shot region SC of the wafer W by using a method such as an inkjet method.

Next, as illustrated in FIG. 4B, by pressing the template TM on the imprinting material 12C', an imprinting pattern 12C is formed on the wafer W.

Thereafter, by irradiating the imprinting pattern 12C with ultraviolet light through the template TM with the template TM pressed on the imprinting pattern 12C, the imprinting pattern 12C cures.

When forming the imprinting pattern 12C at the shot region SC, the transfer regions T2 and T4 of the template TM can be pressed on the imprinting material 12C'. Therefore, at the shot region SA, the transfer regions T1 and T3 of the template TM can be used; at the shot region SC, the transfer regions T2 and T4 of the template TM can be used. Thus, in the case where imperfect shots result at the shot regions SA and SC too, the number of the transfer performed using the shot regions T1 to T4 of the template TM can be evened out, whereby the life of the template TM can be lengthened.

Figure 5A:
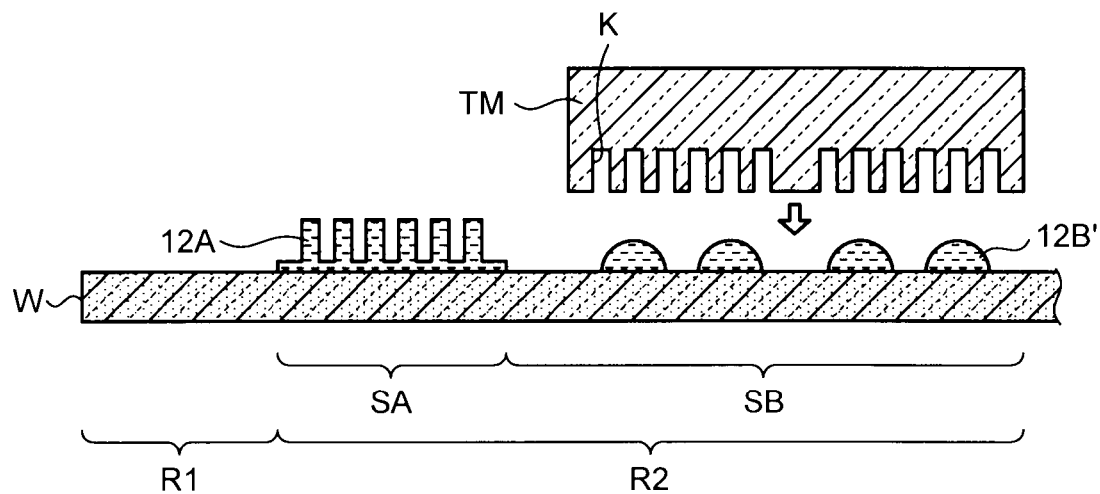
FIGS. 5A and 5B are cross-sectional views illustrating an imprinting method employed at the shot region SB of FIG. 2A.
Figure 5B:
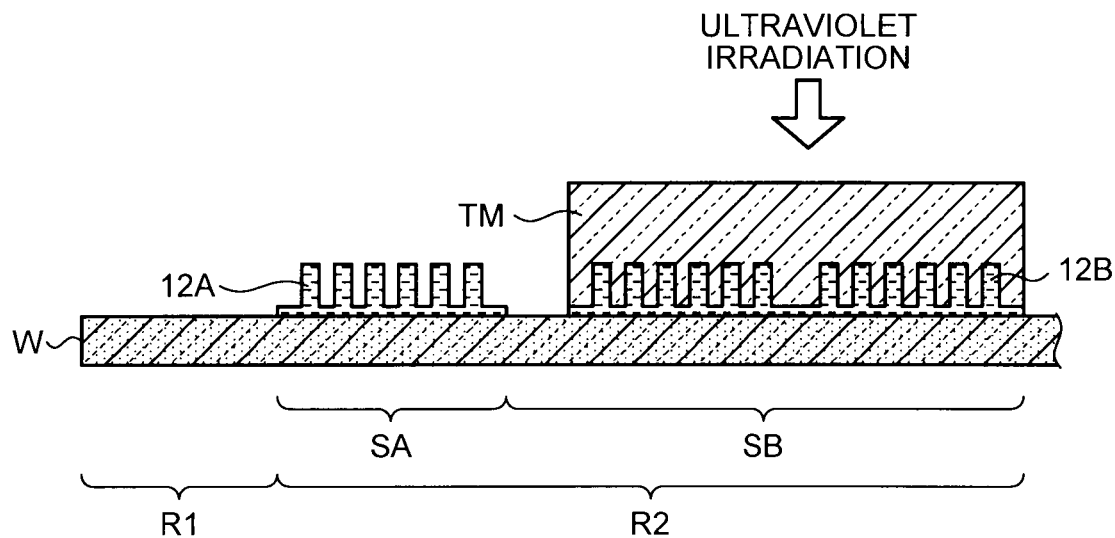

FIGS. 5A and 5B are cross-sectional views illustrating an imprinting method employed at the shot region SB of FIG. 2A.

As illustrated in FIG. 5A, an imprinting material 12B' is delivered through the nozzle 4 onto the shot region SB by using a method such as an inkjet method.

Next, as illustrated in FIG. 5B, the template TM is pressed on the imprinting material 12B' to form an imprinting pattern 12B on the wafer W.

Thereafter, by irradiating the imprinting pattern 12B with ultraviolet light through the template TM with the template TM pressed on the imprinting pattern 12B, the imprinting pattern 12B cures.

In this case, by forming the imprinting pattern 12B at the shot region SB after the formation of the imprinting pattern 12A at the shot region SA, it is possible to prevent the imprinting pattern 12B at the shot region SB from being damaged.

After the formation of the imprinting patterns at all the shot regions SH of the wafer W, the wafer W is processed via the imprinting patterns, whereby semiconductor devices can be made on the wafer W. Incidentally, as a method for processing the wafer W, etching processing may be performed, or ion implantation processing may be performed.

Although the case where the template TM is provided with the four transfer regions T1 to T4 has been taken as an example in this embodiment, the template TM can be provided with N transfer regions. And further, although the case where the transfer regions T1 to T4 correspond respectively to the chip regions C1 to C4 of the wafer W has been taken as an example in FIGS. 2A and 2B, the transfer regions T1 to T4 may correspond to circuit blocks and so on. Furthermore, although the case where the wafer W is used as an underlying layer for the imprinting pattern formation has been described as an example in the first embodiment, a conductive layer or an insulating layer may be formed on the wafer W as the underlying layer for the imprinting pattern formation.

Second Embodiment

In the first embodiment has been described the method in which pattern transfer to the shot region SA is performed using the transfer regions T1 and T3 of the template TM, and pattern transfer to the shot region SC is performed using the transfer regions T2 and T4 of the template TM; however even in this method, the number of the transfer performed using the transfer regions T1 and T3 of the template TM comes to 60 times, and the number of the transfer performed using the transfer regions T2 and T4 of the template TM comes to 61 times, that is, there is a difference in the number of the transfer between the transfer regions T1 and T3 and the transfer regions T2 and T4.

On the other hand, at a first wafer W used in a second embodiment, pattern transfer to the shot region SA is performed using the transfer regions T1 and T3 of the template TM, and pattern transfer to the shot region SC is performed using the transfer regions T2 and T4 of the template TM. Then, at a second wafer W, pattern transfer to the shot regions SA and SC can be performed using the transfer regions T1 and T3 of the template TM.

In that case, at the first wafer W, the number of the transfer performed using the transfer regions T1 and T3 of the template TM comes to 60 times, and the number of the transfer performed using the transfer regions T2 and T4 of the template TM comes to 61 times. At the second wafer W, the number of the transfer performed using the transfer regions T1 and T3 of the template TM comes to 61 times, and the number of the transfer performed using the transfer regions T2 and T4 of the template TM comes to 60 times. Therefore, at the two wafers W, the total number of the transfer performed using the transfer regions T1 to T4 of the template TM comes to 121 times, and thus a correspondence is seen between the number of the transfer performed using the transfer regions T1 and T3 and the number of the transfer performed using the transfer regions T2 and T4. That is, by selecting the transfer regions T1 to T4 such that the number of pattern transfer performed using the transfer regions T1 to T4 is evened out with respect to the M wafers W (M is a positive integer), the correspondence between the number of the transfer performed using the transfer regions T1 to T4 can be implemented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern transfer apparatus comprising a transfer region selecting part that performs operation in which when performing pattern transfer from a template provided with N transfer regions (N is an integer of 2 or larger) to a transferring substrate a plurality of times, 1 to N−1 transfer regions, which are to be used to perform the transfer to regions of the transferring substrate corresponding to part of the N transfer regions, are selected such that the number of the transfer to be performed using each of the N transfer regions is evened out.

2. The pattern transfer apparatus according to claim 1, further comprising a transfer order setting part which sets order of the pattern transfer to the transferring substrate such that the transfer regions that have not been selected when selecting the 1 to N−1 transfer regions do not collide with each of transfer-performed regions of the transferring substrate.

3. The pattern transfer apparatus according to claim 1, wherein the transfer region selecting part selects the transfer regions such that the number of the transfer to M transferring substrates (M is a positive integer) to be performed using each of the N transfer regions is evened out.

4. The pattern transfer apparatus according to claim 1, wherein each of the transfer regions corresponds to chip region of a wafer used as the transferring substrate.

5. The pattern transfer apparatus according to claim 4, wherein a pattern forming region of the wafer is provided with a shot region corresponding to the N transfer regions, there is a region where imperfect shot will result at a perimeter of the pattern forming region, and only part of the N transfer regions of the template is used when performing pattern transfer to the region where the imperfect shot will result.

6. The pattern transfer apparatus according to claim 5, further comprising a transfer order setting part that sets order of pattern transfer to the shot region of the pattern forming region and to the region where the imperfect shot will result of the wafer such that an unused transfer region of the N transfer regions does not collide with an adjacent pattern-transferred shot region when performing pattern transfer to the region where the imperfect shot will result.

7. A pattern transfer apparatus comprising:
a stage that holds a wafer used as a transferring substrate;
driving parts that move the stage back and forth, and right and left;
a nozzle that delivers an imprinting material onto the wafer;
an ultraviolet irradiating unit that irradiates the imprinting material on the wafer with ultraviolet light via a template provided with N transfer regions (N is an integer of 2 or larger); and
a driving control unit that controls the driving parts so as to even out the number of pattern transfer to be performed using each of the N transfer regions.

8. The pattern transfer apparatus according to claim 7, wherein the driving control unit comprises a transfer region selecting part that performs operation in which when performing pattern transfer from the template provided with the N transfer regions to the transferring substrate a plurality of times such that the number of the transfer to be performed using each of the N transfer regions is evened out, 1 to N−1 transfer regions, which are to be used to perform the transfers to regions of the transferring substrate corresponding to part of the N transfer regions, are selected.

9. The pattern transfer apparatus according to claim 8, wherein the driving control unit further comprises a transfer order setting part that sets order of pattern transfer to the transferring substrate such that the transfer regions, which have not been selected when selecting the 1 to N−1 transfer regions, do not collide with each of transfer-performed regions of the transferring substrate.

10. The pattern transfer apparatus according to claim 8, wherein the transfer region selecting part selects the transfer regions such that the number of the transfer to M transferring substrates (M is a positive integer) to be performed using each of the N transfer regions is evened out.

11. The pattern transfer apparatus according to claim 7, wherein the each of transfer regions corresponds to chip region of the wafer used as the transferring substrate.

12. The pattern transfer apparatus according to claim 11, wherein a pattern forming region of the wafer is provided with a shot region corresponding to the N transfer regions, there is a region where imperfect shot will result at a perimeter of the pattern forming region, and only part of the N transfer regions of the template is used when performing pattern transfer to the region where the imperfect shot will result.

13. The pattern transfer apparatus according to claim 12, wherein the driving control unit comprises a transfer order setting part that sets order of pattern transfer to the shot region of the pattern forming region and to the region where the imperfect shot will result of the wafer such that when performing pattern transfer to the region where the imperfect shot will result, an unused transfer region of the N transfer regions does not collide with an adjacent pattern-transferred shot region.

14. A method for fabricating a semiconductor device comprising:
forming imprinting patterns by repeating process wherein when performing pattern transfer to regions of a transferring substrate corresponding to part of N transfer regions (N is an integer of 2 or larger) provided at a template, 1 to N−1 transfer regions are selected such that the number of the transfer to be performed using each of the N transfer regions is evened out, and the pattern transfer is performed by applying an imprinting material onto an underlying layer of the transferring substrate and pressing the template on the imprinting material; and
processing the underlying layer via the imprinting patterns formed on the underlying layer.

15. The method for fabricating a semiconductor device according to claim 14, wherein concave portions corresponding to the imprinting patterns are formed in the template, and the imprinting patterns are irradiated with ultraviolet light through the template with the template pressed on the imprinting material to cure the imprinting patterns.

16. The method for fabricating a semiconductor device according to claim 14, wherein order of the transfer to the transferring substrate is set such that the transfer regions, which have not been selected when selecting the 1 to N−1 transfer regions, do not collide with each of transfer-performed regions of the transferring substrate.

17. The method for fabricating a semiconductor device according to claim 14, wherein the transfer regions are selected such that the number of the transfer to the M transferring substrates (M is a positive integer) performed using each of the N transfer regions is evened out.

18. The method for fabricating a semiconductor device according to claim 14, wherein each of the transfer regions corresponds to chip region of a wafer used as the transferring substrate.

19. The method for fabricating a semiconductor device according to claim 18, wherein a pattern forming region of the wafer is provided with a shot region corresponding to the N transfer regions.

20. The method for fabricating a semiconductor device according to claim 19, wherein there is a region where imperfect shot will result at a perimeter of the pattern forming region, and only part of the N transfer regions of the template is used when performing pattern transfer to the region where the imperfect shot will result.

\* \* \* \* \*